United States Patent
Tsai et al.

(10) Patent No.: US 8,169,275 B2
(45) Date of Patent: May 1, 2012

(54) CIRCUIT BOARD WITH JUMPER STRUCTURE

(75) Inventors: Wen-Tsai Tsai, Hsinchu (TW); Wen-Chen Lan, Hsinchu (TW)

(73) Assignee: Wistron NeWeb Corporation, Hsinchu Science Park, Hsinchu (TW)

( * ) Notice: Subject to any disclaimer, the term of this patent is extended or adjusted under 35 U.S.C. 154(b) by 105 days.

(21) Appl. No.: 12/894,147

(22) Filed: Sep. 30, 2010

(65) Prior Publication Data

US 2011/0316644 A1 Dec. 29, 2011

(30) Foreign Application Priority Data

Jun. 28, 2010 (TW) ................................ 99121044 A

(51) Int. Cl.
*H03H 7/38* (2006.01)
*H01P 5/02* (2006.01)
(52) U.S. Cl. .......................................... 333/33; 333/238
(58) Field of Classification Search .................... 333/33, 333/1, 238, 246
See application file for complete search history.

(56) References Cited

U.S. PATENT DOCUMENTS

| 4,675,620 | A | * | 6/1987 | Fullerton | 333/1 |
| 5,117,207 | A | * | 5/1992 | Powell et al. | 333/1 |
| 5,682,124 | A | * | 10/1997 | Suski | 333/1 |
| 6,522,214 | B1 | * | 2/2003 | Harju et al. | 333/1 |
| 7,463,110 | B2 | * | 12/2008 | Lapierre et al. | 333/26 |
| 7,812,694 | B2 | * | 10/2010 | Ding et al. | 333/238 |

* cited by examiner

*Primary Examiner* — Stephen Jones
(74) *Attorney, Agent, or Firm* — Winston Hsu; Scott Margo

(57) ABSTRACT

A circuit board with jumper structure is disclosed. The circuit board includes a substrate, a ground layer, a first signal transmission line, and a second signal transmission line. The ground layer is formed on a second plane of the substrate. The first signal transmission line is formed on a first plane of the substrate, and coupled to a first signal end and a second signal end. A first signal transmitted on the first signal transmission line in a combination method of a microstrip line to co-planar waveguide transition and a co-planar waveguide to microstrip line transition. The second signal transmission line is formed on the second plane of the substrate, and coupled to a third signal end and a fourth signal end. A second signal is transmitted on the second signal transmission line in the co-planar waveguide transmission.

14 Claims, 9 Drawing Sheets

US 8,169,275 B2

CIRCUIT BOARD WITH JUMPER STRUCTURE

BACKGROUND OF THE INVENTION

1. Field of the Invention

The invention relates to a circuit board with a jumper structure, and more particularly, to a circuit board capable of utilizing a combination structure of a microstrip line to co-planar waveguide transition and a co-planar waveguide to microstrip line transition for realizing a signal jumper.

2. Description of the Prior Art

With the rapid progression of technology, the development trend of electronic products is toward thin profile, light weight, and small size. Therefore, circuit design of a printed circuit board is getting complicated. In such a situation, a jumper can be used for avoiding occurrences of signal lines being cross-connected and a mutual interference effect. Please refer to FIG. 1, which is a schematic diagram of a jumper application using an air bridge according to the prior art. As shown in FIG. 1, a first signal S1 is transmitted from an input signal end P1 to a transmission line L1 and further to a transmission line L2 via a metal structure A, so that the first signal S1 can be outputted from an output signal end P2. Similarly, the second signal S2 is transmitted from an input signal end P3 to a transmission line L3 and further outputted from an output signal end P4. As can been seen in FIG. 1, through the metal structure A, the first signal S1 can pass over the transmission line L3 transmitting the second signal S2 with the air bridge method so that mutual interference does not occur between the first signal S1 and the second signal S2. Although using the air bridge method for realizing the jumper provides good isolation, the insertion loss is too great and the return loss is too small. Thus, as the distance between the metal structure A and the transmission line L3 becomes larger, the corresponding characteristics of the insertion loss and the return loss degrade accordingly. Also, when the return loss is too low, mismatch occurs easily in component connections. Therefore, during the manufacturing process, if any mount offset occurs, the related component may require readjustment.

In addition, please refer to FIGS. 2A and 2B, which are respectively a top-view and a bottom-view diagram of a jumper application using a conducting wire according to the prior art. As shown in FIGS. 2A and 2B, a conducting wire ML is used as a jumper for a signal line on a backplane of a substrate. Compared with the above-mentioned air bridge jumper method, the conducting wire jumper method offers better circuit characteristics. However, in the conducting wire jumper method, the conducting wire ML needs to be soldered manually to mount it on the substrate, i.e. the conducting wire ML cannot be mounted through surface mount assembly technology, making assembly time consuming, laborious, and expensive.

SUMMARY OF THE INVENTION

It is therefore a primary objective of the claimed invention to provide a circuit board with a jumper structure.

An embodiment of the invention discloses a circuit board with a jumper structure, which includes a substrate comprising a first plane and a second plane; a ground layer disposed on the second plane of the substrate; a first signal end formed on the first plane of the substrate for receiving a first signal; a second signal end formed on the first plane of the substrate for outputting the first signal; a third signal end formed on the first plane of the substrate for receiving a second signal; a fourth signal end formed on the first plane of the substrate for outputting the second signal; a first signal transmission line formed on the first plane of the substrate, the first signal transmission line comprising: a first signal transfer end; a second signal transfer end; a front transmission line coupled to the first signal end and the first signal transfer end; a first middle transmission line coupled to the first signal transfer end and the second signal transfer end; a back transmission line coupled to the second signal transfer end and the second signal end; and a plurality of ground pads respectively disposed on both sides of the first middle transmission line and each ground pad coupled to the ground layer; and a second signal transmission line formed on the second plane of the substrate, the second signal transmission line comprising: a first signal transmission end coupled to the third signal end; a second signal transmission end coupled to the fourth signal end; and a second middle transmission line coupled to the first signal transmission end and the second signal transmission end; wherein the first signal is transmitted in a microstrip line transmission method between the first signal end and the first signal transfer end and between the second signal transfer end and the second signal end, the first signal is transmitted in a co-planar waveguide method between the first signal transfer end and the second signal transfer end, and the second signal is transmitted in the co-planar waveguide method between the first signal transmission end and the second signal transmission end.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
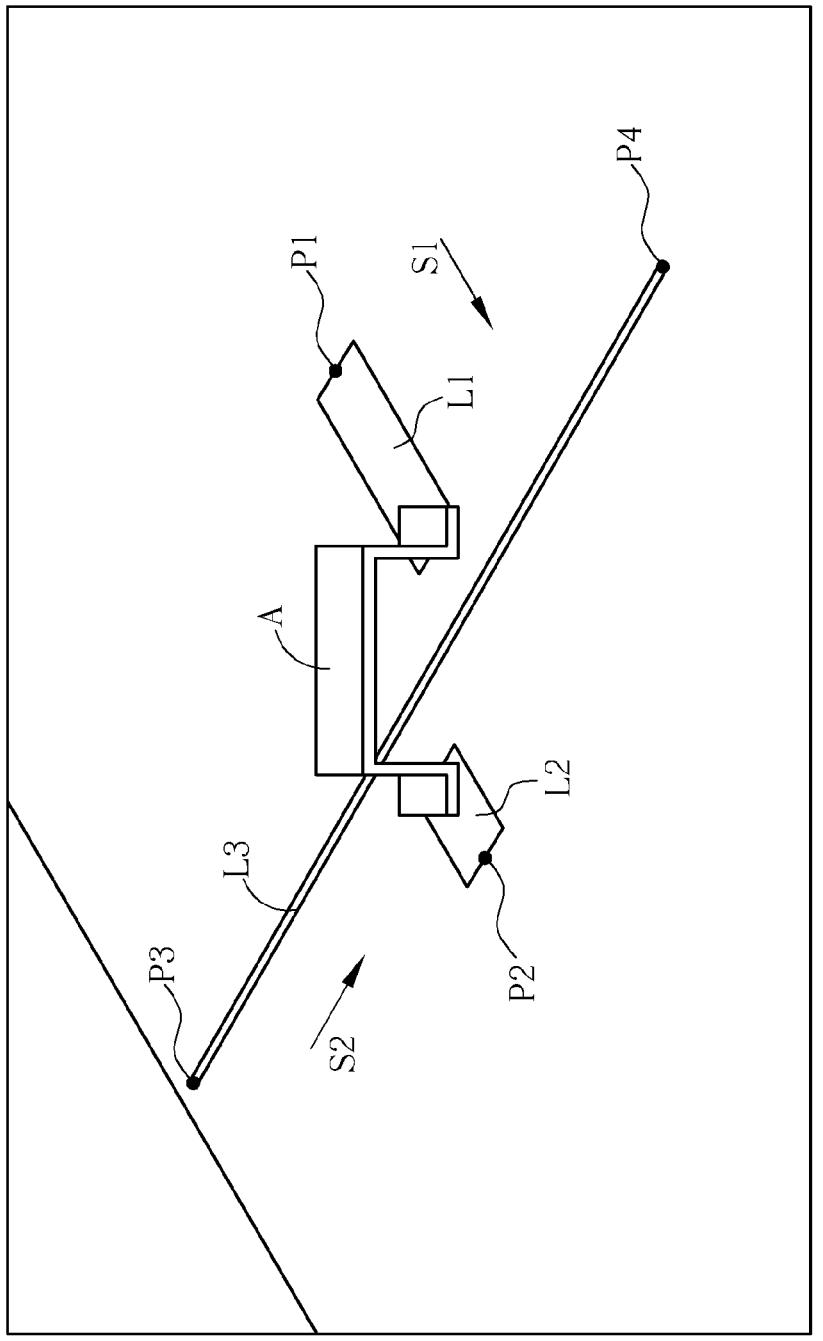
FIG. 1 is a schematic diagram of a jumper application using an air bridge according to the prior art.
Figure 2A:
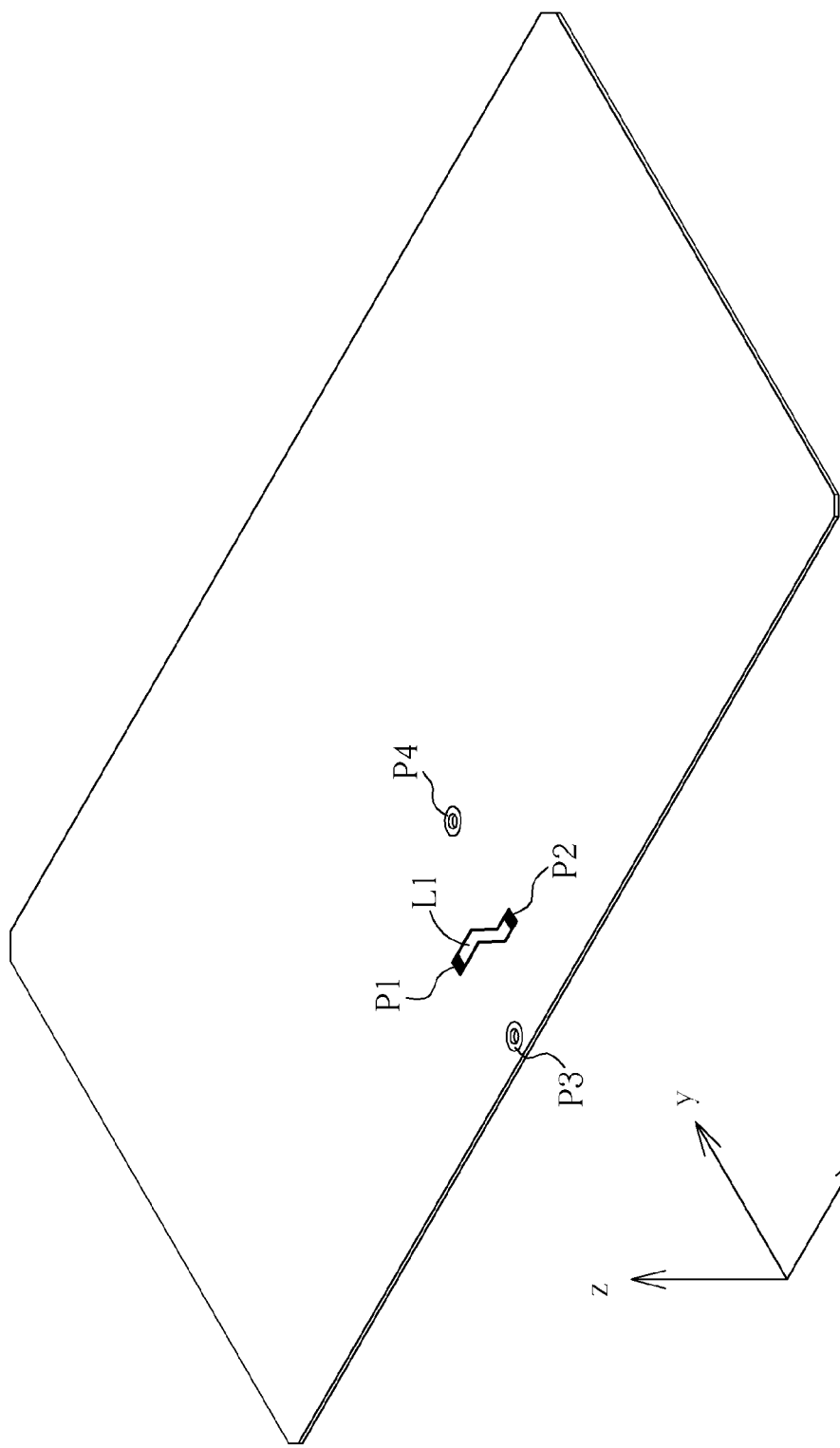
FIG. 2A is a top-view diagram of a jumper application using a conducting wire according to the prior art.
Figure 2B:
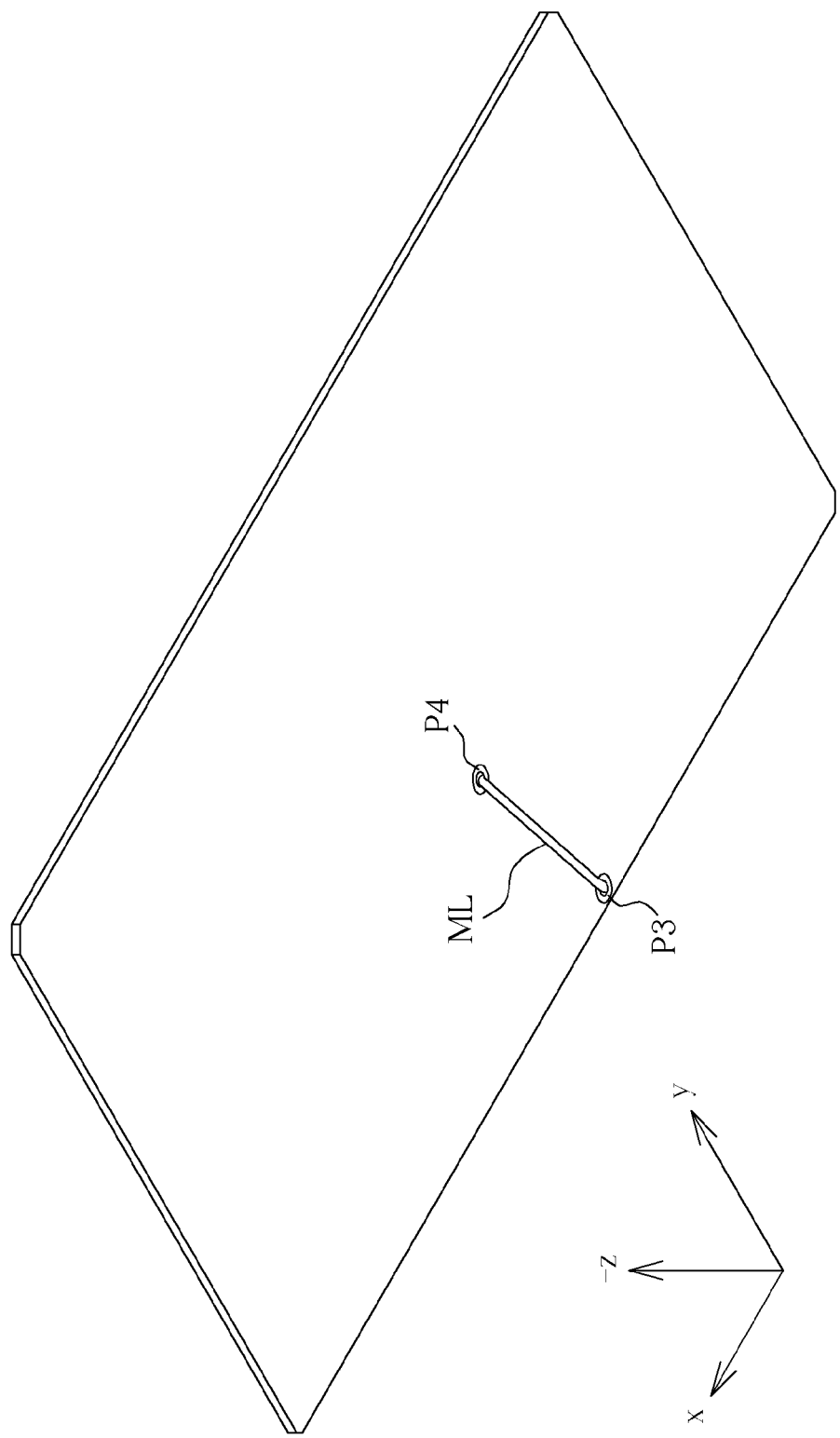
FIG. 2B is a bottom-view diagram of a jumper application using a conducting wire according to the prior art.
Figure 3:
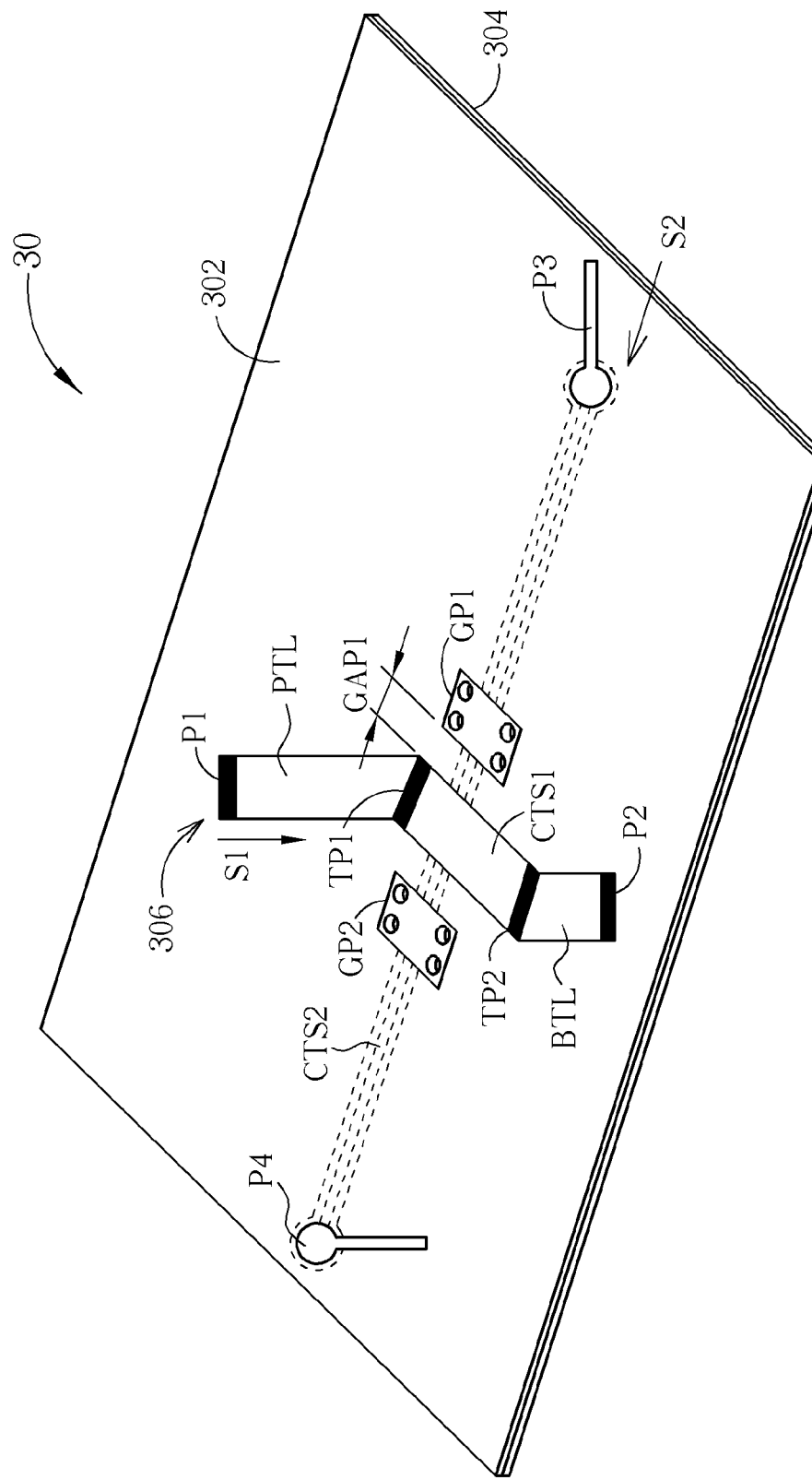
FIG. 3 is a top-view diagram of a circuit board according to an embodiment of the invention.
Figure 4:
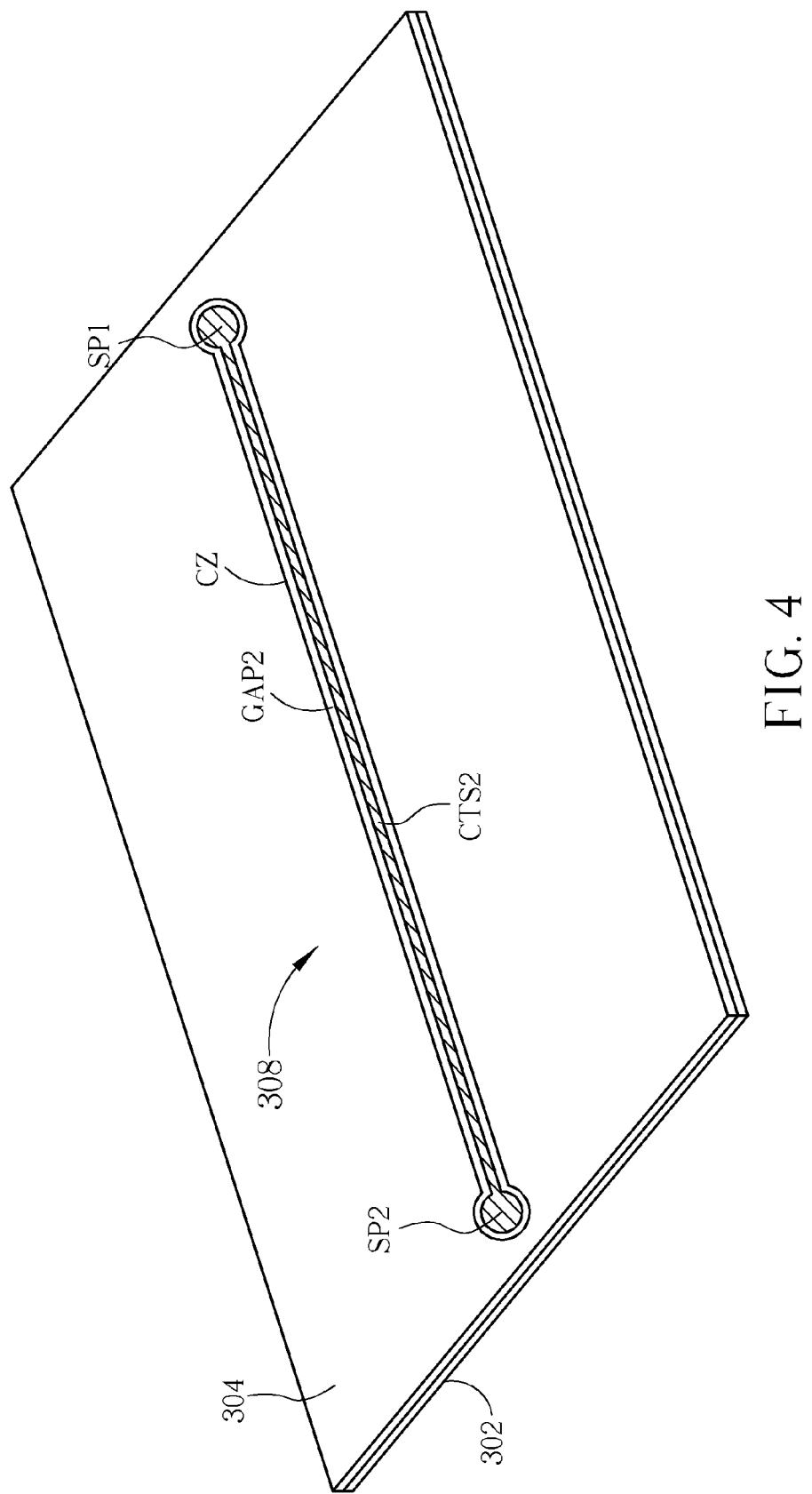
FIG. 4 is a bottom-view diagram of a circuit board according to an embodiment of the invention.

Please refer to FIG. 3 and FIG. 4, which are respectively a top-view and a bottom-view diagram of a circuit board 30 according to an embodiment of the invention. The circuit board 30 includes a substrate 302, a ground layer 304, a first signal transmission line 306, a second signal transmission line 308, and signal ends P1, P2, P3, and P4. As can been seen in FIGS. 3 and 4, the substrate 302 includes a first plane and a second plane. The first signal transmission line 306 and the signal ends P1, P2, P3, and P4 are formed on the first plane of the substrate 302. The ground layer 304 is disposed on the second plane of the substrate 302 for providing grounding. The signal end P1 is utilized for receiving a first signal S1; the signal end P2 is utilized for outputting the first signal S1. The signal end P3 is utilized for receiving a second signal S2; the signal end P4 is utilized for outputting the second signal S2.

The first signal transmission line 306 includes signal transfer ends TP1 and TP2, a front transmission line PTL, a middle transmission line CTS1, a back transmission line BTL, and ground pads GP1 and GP2. The front transmission line PTL is coupled to the signal end P1 and the signal transfer end TP1. The back transmission line BTL is coupled to the signal transfer end TP2 and the signal end P2. The middle transmission line CTS1 is coupled between the signal transfer ends TP1 and TP2. The ground pads GP1 and GP2 are respectively disposed on both sides of the middle transmission line CTS1 and coupled to the ground layer 304. In addition, first gaps GAP1 are formed among the ground pads GP1 and GP2, and the middle transmission line CTS1. For example, a first gap GAP1 exists between the ground pad GP1 and the middle transmission line CTS1, and another first gap GAP1 exists between the ground pad GP2 and the middle transmission line CTS1. When the first signal S1 is inputted to the signal end P1, the first signal S1 can be transmitted from the signal end P1 to the signal transfer end TP1 via the front transmission line PTL in a microstrip line transmission method. Moreover, the middle transmission line CTS1 and the ground pads GP1 and GP2 form a first co-planar feed region CPW1 (not shown in FIG. 3). Therefore, the first signal S1 can be transmitted from the signal transfer end TP1 to the signal transfer end TP2 by a co-planar waveguide transmission method. After that, the first signal S1 can be transmitted from the signal transfer end TP2 to the signal end P2 via the back transmission line BTL in the microstrip line transmission method, and outputted from the signal end P2. In other words, when the first signal S1 has been transmitted to the signal transfer end TP1, the first signal S1 can be further transmitted to the signal transfer end TP2 by a microstrip line to co-planar waveguide transition. Similarly, when the first signal S1 has been transmitted to the signal transfer end TP2, the first signal S1 can be further transmitted to the following signal end with a co-planar waveguide to microstrip line transition.

The second signal transmission line 308 includes signal transmission ends SP1 and SP2, and a middle transmission line CTS2. The signal transmission end SP1 is coupled to the signal end P3. The signal transmission end SP2 is coupled to the signal end P4. The middle transmission line CTS2 is coupled between the signal transmission end SP1 and the signal transmission end SP2. When the second signal S2 is inputted to the signal end P3, the second signal S2 can be transmitted to the signal transmission end SP1. Because the middle transmission line CTS2 and the ground layer 304 form a second co-planar feed region CPW2 (not shown in FIG. 4), the second signal S2 can be transmitted from the signal transmission end SP1 to the signal transmission end SP2 in the co-planar waveguide method. Finally, the second signal S2 can be transmitted from the signal transmission end SP2 to the signal end P4 and outputted from the signal end P4. In brief, the second signal S2 is transmitted on the second plane of the substrate 302 through a co-planar waveguide structure.

Therefore, the invention can change the electrical field vertical to the substrate 302 when using microstrip line transmission to the electrical field parallel to the substrate 302 when using co-planar waveguide transmission in order to prevent an electrical field introduced by signal transmission of one signal line from passing across another signal line to avoid discontinuous electrical field distribution.

Figure 5:
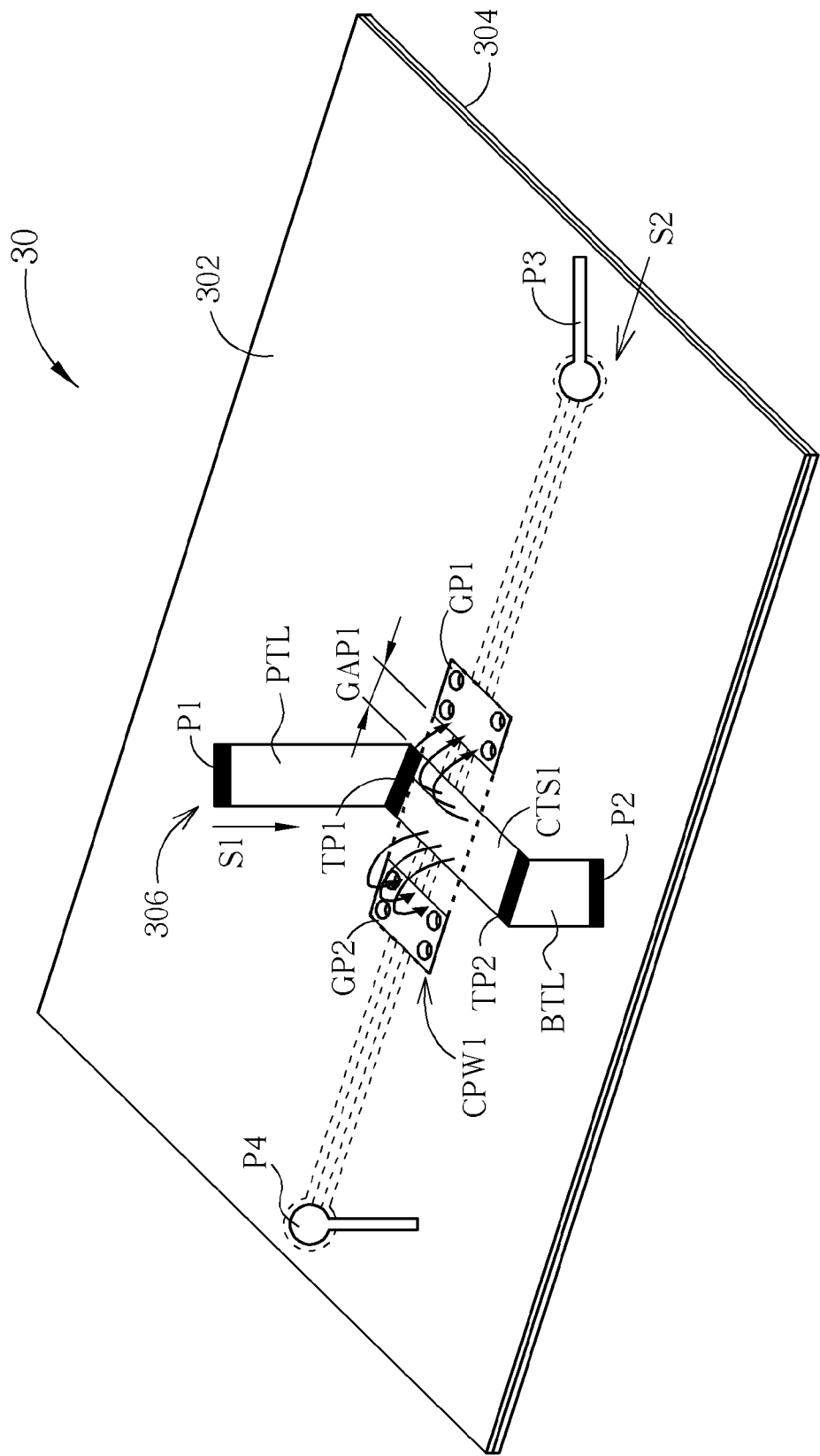
FIG. 5 is a schematic diagram of electrical field distribution of the first co-planar feed region of the circuit board shown in FIG. 3.
Figure 6:
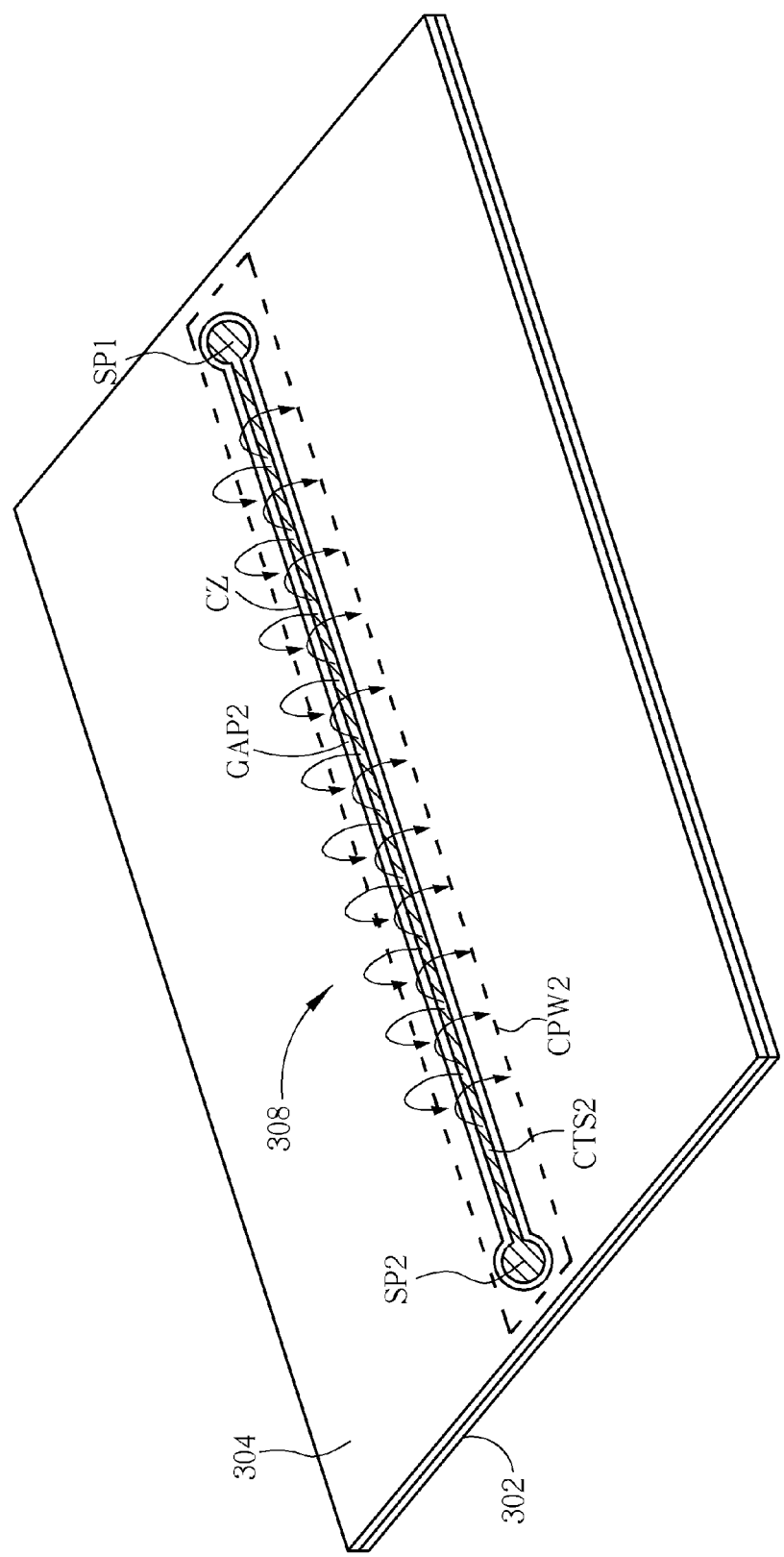
FIG. 6 is a schematic diagram of electrical field distribution of the second co-planar feed region of the circuit board shown in FIG. 4.

Furthermore, please refer to FIGS. 5 and 6. FIG. 5 is a schematic diagram of electrical field distribution of the first co-planar feed region CPW1 of the circuit board 30 shown in FIG. 3. FIG. 6 is a schematic diagram of electrical field distribution of the second co-planar feed region CPW2 of the circuit board 30 shown in FIG. 4. The arrows indicate direction of electrical field. As shown in FIG. 5, the electrical fields in the first co-planar feed region CPW1 are distributed on the first plane of the substrate 302. As shown in FIG. 6, the electrical fields in the second co-planar feed region CPW2 are distributed on the second plane of the substrate 302. In other words, regarding the intersection of the first signal transmission line 306 and the second signal transmission line 308, the first signal S1 and the second signal S2 can be transmitted on each independent path transmission respectively. This means, the first signal S1 is transmitted on the first plane of the substrate 302 and the second signal S2 is transmitted on the second plane of the substrate 302, so as to avoid the mutual interference effect.

In detail, the second signal transmission line 308 can be formed on a position of the second plane of the substrate 302 corresponding to the first co-planar feed region CPW1, i.e. the second signal transmission line 308 can be disposed across an area on the second plane of the substrate 302 corresponding to the first co-planar feed region CPW1. In such a situation, when the first signal transmission line 306 passes across the second signal transmission line 308, the microstrip line to co-planar waveguide transition can be utilized for realizing a jumper purpose.

In addition, please refer to FIG. 4. The ground layer 304 includes an empty area CZ. There is no component disposed in the empty area CZ. Moreover, the empty area CZ is a non-conducting area. In other words, the empty area CZ is reserved on the second plane of the substrate 302. Preferably, the signal transmission end SP1, the signal transmission end SP2, and the middle transmission line CTS2 are formed within the empty area CZ and not coupled to the ground layer 304. As shown in FIG. 4, a second gap GAP2 is formed among the signal transmission end SP1, the signal transmission end SP2, and the middle transmission line CTS2. Note that the ground pads GP1 and GP2 should not be coupled to the empty area CZ in order to avoid losing grounding effect.

Note that, the circuit board 30 is an exemplary embodiment of the invention, and those skilled in the art can make alterations and modifications accordingly. For example, the front transmission line PTL, the back transmission line BTL, and the middle transmission lines CTS1 and CTS2 are respectively microstrip line structures. The first signal S1 and the second signal S2 can be direct current power signals, L-band signals, Ka-band signals, or Ku-band signals, and these should not be a limitation of the invention. Moreover, as shown in FIG. 3, both the ground pads GP1 and GP2 are coupled to the ground layer 304 by using four through holes. Of course, the ground pads GP1 and GP2 can also be coupled to the ground layer 304 by using two through holes or any other amount of through holes. Besides, the signal end P3 can be coupled to the signal transmission end SP1 through a through hole; the signal end P4 can be coupled to the signal transmission end SP4 through a through hole.

Figure 7:
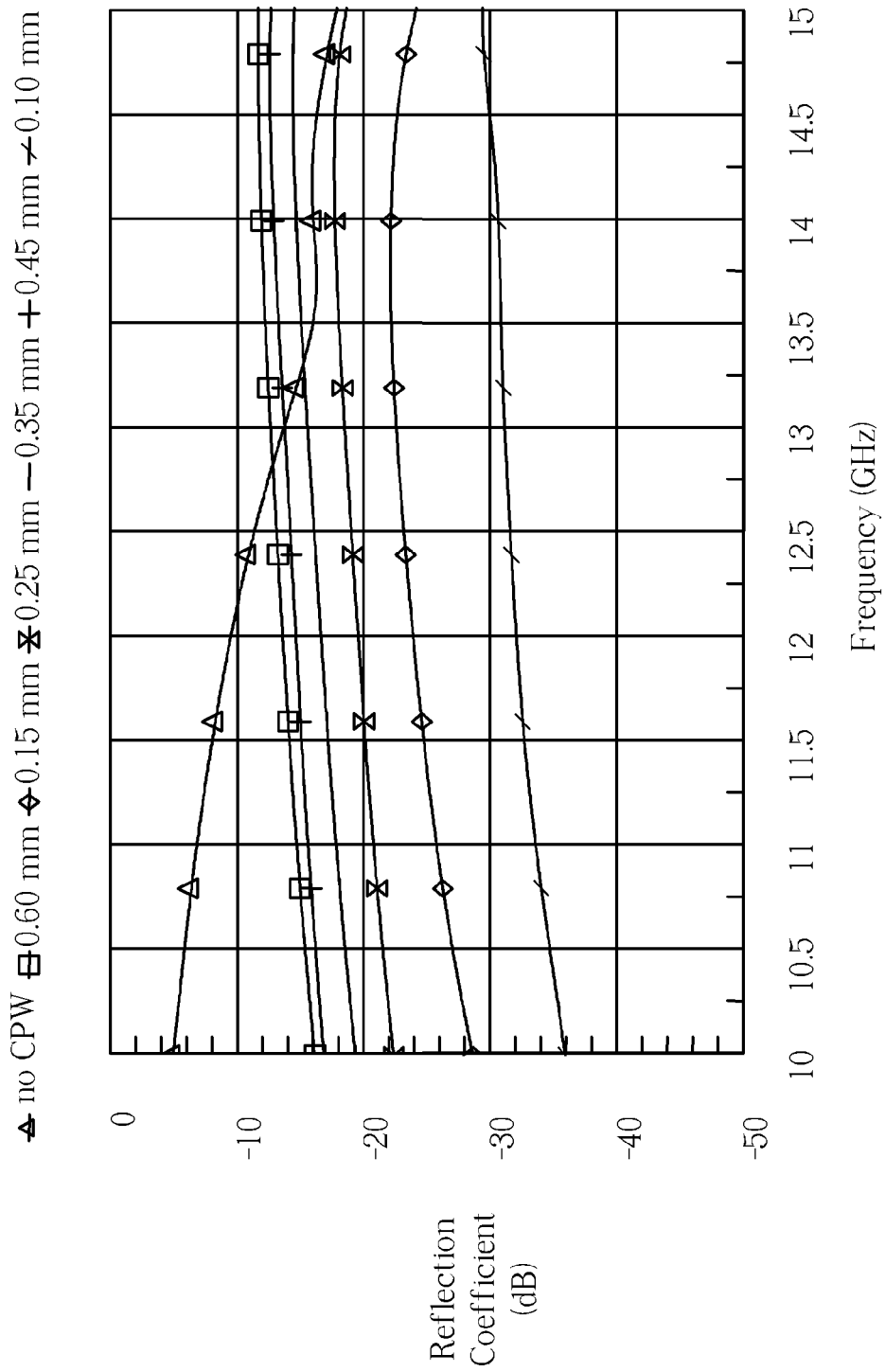
FIG. 7 is a simulation result of reflection coefficient of the circuit board shown in FIG. 3 when using the first gap of various lengths.
Figure 8:
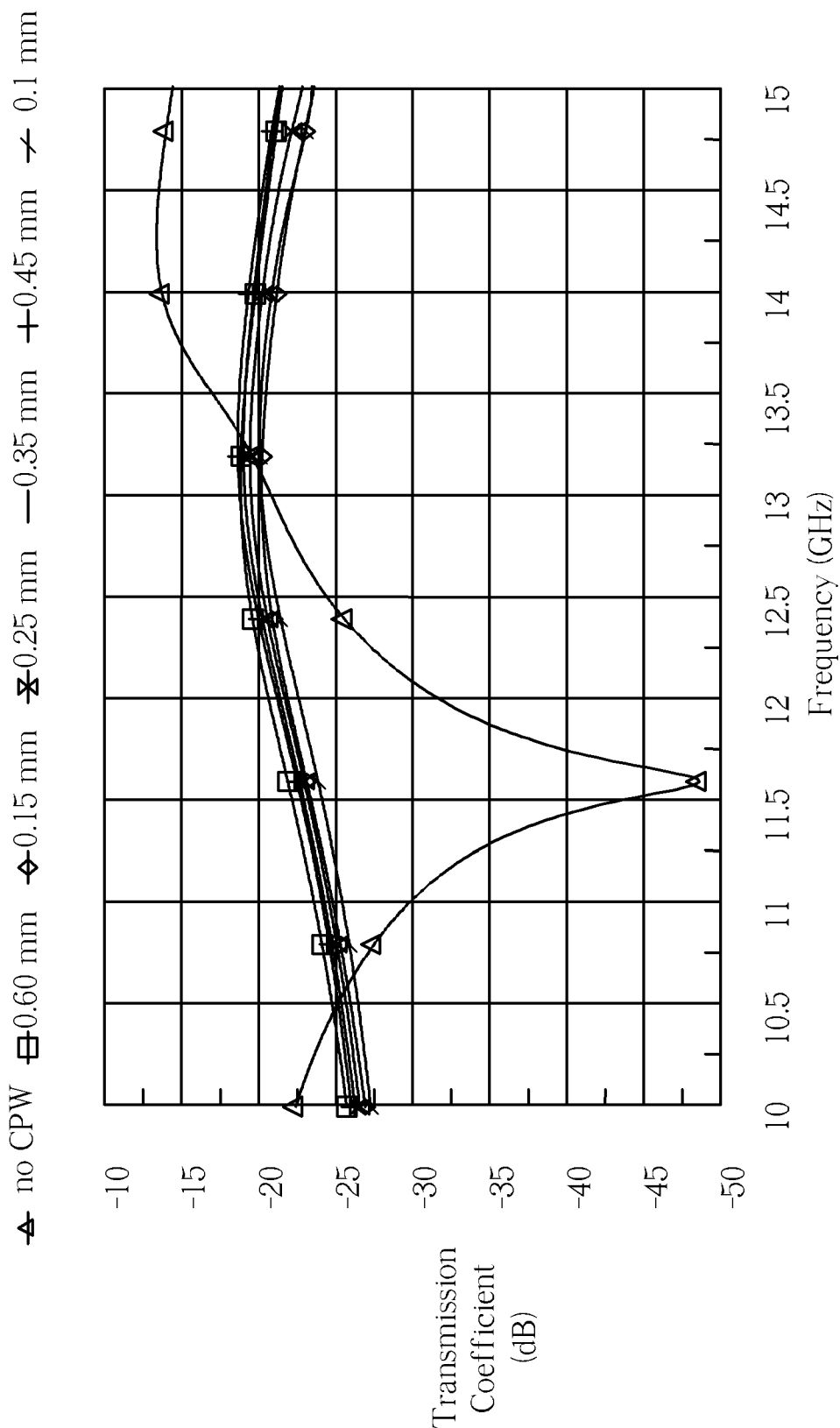
FIG. 8 is a simulation result of transmission coefficient of the circuit board shown in FIG. 3 when using the first gap of various lengths.

For example, suppose the first signal S1 is a Ku-band signal which is operated in a range of 10.7 GHz to 12.75 GHz, and the second signal S2 is a direct current power signal. As can been seen in FIGS. 7 and 8, the simulation results of the circuit board 30 using the first gap GAP1 of various lengths are represented. Referring to FIG. 7, the reflection coefficients of the circuit board 30 are below −10 dB so that the circuit board 30 has excellent circuit characteristics. Referring to FIG. 8, the circuit board 30 of the invention has excellent isolation characteristics.

In summary, the invention is capable of utilizing a combination structure of a microstrip line to co-planar waveguide transition and a co-planar waveguide to microstrip line transition for realizing a signal jumper. For circuit layout design, the invention requires only a little modification of the circuit layout without any manual soldering operations or mounting assembly processes, so as to cross another signal line easily, reducing manufacturing cost substantially. More particularly, the invention can dispose signal lines on both planes and thus provide good electrical isolation, circuit characteristics, and circuit stability.

Those skilled in the art will readily observe that numerous modifications and alterations of the device and method may be made while retaining the teachings of the invention.

What is claimed is:

1. A circuit board with jumper structure comprising:
a substrate comprising a first plane and a second plane;
a ground layer disposed on the second plane of the substrate;
a first signal end formed on the first plane of the substrate for receiving a first signal;
a second signal end formed on the first plane of the substrate for outputting the first signal;
a third signal end formed on the first plane of the substrate for receiving a second signal;
a fourth signal end formed on the first plane of the substrate for outputting the second signal;
a first signal transmission line formed on the first plane of the substrate, the first signal transmission line comprising:
a first signal transfer end;
a second signal transfer end;
a front transmission line coupled to the first signal end and the first signal transfer end;
a first middle transmission line coupled to the first signal transfer end and the second signal transfer end;
a back transmission line coupled to the second signal transfer end and the second signal end; and
a plurality of ground pads respectively disposed on both sides of the first middle transmission line, each ground pad coupled to the ground layer; and
a second signal transmission line formed on the second plane of the substrate, the second signal transmission line comprising:
a first signal transmission end coupled to the third signal end;
a second signal transmission end coupled to the fourth signal end; and
a second middle transmission line coupled to the first signal transmission end and the second signal transmission end;
wherein the first signal is transmitted in a microstrip line transmission method between the first signal end and the first signal transfer end and between the second signal transfer end and the second signal end, the first signal is transmitted in a co-planar waveguide method between the first signal transfer end and the second signal transfer end, and the second signal is transmitted in the co-planar waveguide method between the first signal transmission end and the second signal transmission end.

2. The circuit board of claim 1 further comprising a first gap among the first middle transmission line and the plurality of ground pads.

3. The circuit board of claim 1, wherein the front transmission line, the first middle transmission line, and the back transmission line are disposed along a first direction and the second middle transmission line is disposed along a second direction different from the first direction.

4. The circuit board of claim 1, wherein the front transmission line, the back transmission line, the first middle transmission line, and the second middle transmission line are respectively microstrip line structures.

5. The circuit board of claim 1, wherein each ground pad is coupled to the ground layer by a through hole.

6. The circuit board of claim 1, wherein the second middle transmission line and the ground layer form a second co-planar feed region.

7. The circuit board of claim 6, wherein the second signal is transmitted between the first signal transmission end and the second signal transmission end with the co-planar waveguide method by passing through the second middle transmission line and the ground layer.

8. The circuit board of claim 1, wherein the ground layer comprises an empty area.

9. The circuit board of claim 8, wherein the first signal transmission end, the second signal transmission end, and the second middle transmission line of the second signal transmission line are formed on the second plane of the substrate and positioned within the empty area.

10. The circuit board of claim 9, wherein the first signal transmission end, the second signal transmission end, and the second middle transmission line of the second signal transmission line are unconnected to the ground layer.

11. The circuit board of claim 10 further comprising a second gap among the first signal transmission end, the second signal transmission end, the second middle transmission line, and the ground layer.

12. The circuit board of claim 1, wherein the first middle transmission line and the plurality of ground pads form a first co-planar feed region.

13. The circuit board of claim 12, wherein the first signal is transmitted between the first signal transfer end and the second signal transfer end with the co-planar waveguide method by passing through the first middle transmission line and the plurality of ground pads.

14. The circuit board of claim 12, wherein the second signal transmission line is formed on a position of the second plane of the substrate corresponding to the first co-planar feed region.

* * * * *